US008115835B2

(12) United States Patent
Noguchi et al.

(10) Patent No.: US 8,115,835 B2
(45) Date of Patent: Feb. 14, 2012

(54) PROGRAMMABLE DIGITAL BLACK LEVEL CALIBRATION WITH FEEDBACK CONTROL

(75) Inventors: Yasu Noguchi, Sunnyvale, CA (US); Kazuya Sasaki, Kanagawa (JP)

(73) Assignee: MediaTek Singapore Pte Ltd., Singapore (SG)

( * ) Notice: Subject to any disclaimer, the term of this patent is extended or adjusted under 35 U.S.C. 154(b) by 642 days.

(21) Appl. No.: 12/290,158

(22) Filed: Oct. 27, 2008

(65) Prior Publication Data
US 2009/0059012 A1    Mar. 5, 2009

Related U.S. Application Data

(60) Provisional application No. 61/056,475, filed on May 28, 2008.

(51) Int. Cl.
*H04N 5/217* (2006.01)
*H04N 5/64* (2006.01)
*H04N 5/335* (2006.01)

(52) U.S. Cl. .................. 348/243; 348/241; 348/308

(58) Field of Classification Search .......... 348/241–243, 348/207.99, 220.1, 231.99, 691, 692, 255, 348/308
See application file for complete search history.

(56) References Cited

U.S. PATENT DOCUMENTS

| | | |
|---|---|---|
| 6,597,395 B1 * | 7/2003 | Kim et al. .................. 348/222.1 |
| 6,774,942 B1 | 8/2004 | Salcedo et al. ............... 348/243 |
| 7,084,911 B1 | 8/2006 | Lee et al. ...................... 348/243 |

\* cited by examiner

*Primary Examiner* — Mohammed Hasan
(74) *Attorney, Agent, or Firm* — Imperium Patent Works; Zheng Jin

(57) ABSTRACT

A programmable digital black level calibration circuit comprises a combining circuit, a digital programmable gain amplifier (PGA), and a black level feedback circuit. The combining circuit combines a digital image signal for optical black (OB) pixels and a feedback signal and outputs a digital PGA input signal. The PGA amplifies the digital PGA input signal by a PGA gain value and outputs a digital PGA output signal. The black level feedback circuit receives the digital PGA output signal and a target black level and in response outputs the feedback signal such that a black level of the OB pixels is calibrated with respect to the target black level. The programmable digital black level calibration circuit calibrates the black level in pure digital domain using signed data buses. The target black level is adjustable to a desired positive or negative value independent from the PGA gain value.

23 Claims, 7 Drawing Sheets

BLACK LEVEL CALIBRATION WITH FEEDBACK CONTROL

| | ADC OUT | OB | OB ADJ | PGA IN | PGA OUT | PGA GAIN |
|---|---|---|---|---|---|---|
| AFE 31 FIGURE 2 | 0X1000 | 0X1000 | 0X0100 | 0X0100 | 0X0100 | X 1 |
| | 0X1000 | 0X1000 | 0X0040 | 0X0040 | 0X0100 | X 4 |
| | ADC OUT | OBL | TARGET BLACK | PGA IN | PGA OUT | PGA GAIN |
| AFE 54 FIGURE 5 | 0X1000 | 0X0E00 | 0X0100 | 0X0100 | 0X0100 | X 1 |
| | 0X1000 | 0X0FC0 | 0X0100 | 0X0040 | 0X0100 | X 4 |

OB PIXEL NOISE DISTRIBUTION CURVE

PROGRAMMABLE DIGITAL BLACK LEVEL CALIBRATION WITH FEEDBACK CONTROL

CROSS REFERENCE TO RELATED APPLICATIONS

This application claims priority under 35 U.S.C. §119 from U.S. Provisional Application No. 61/056,475, entitled "Advanced Digital Black Level Calibration in Analog Front End in Digital Camera," filed on May 28, 2008, the subject matter of which is incorporated herein by reference.

TECHNICAL FIELD

The present invention relates generally to digital imaging and, more particularly, to a digital method of programmable black level calibration.

BACKGROUND

A digital camera uses an image sensor to convert an optical image received through a lens to electrical image sensor output data. To improve image quality, the black level of the image sensor output data is calibrated. Typically, the image sensor output data includes both valid pixel data and optical black (OB) pixel data. OB pixels are not illuminated pixels. The black level of the OB pixel data is first calibrated with respect to a desired black level and then used to correct the valid pixel data.

FIG. 1 (prior art) is a simplified block diagram of an analog front end (AFE) integrated circuit 11 having an analog black level calibration circuit. AFE integrated circuit 11 includes a correlated double sampling (CDS) circuit 21, a combining circuit 22, an analog programmable gain amplifier (PGA) 23, an analog-to-digital converter (ADC) 24, a digital offset circuit 25, an engine 26, an averaging circuit 27, a set of registers 28, and a digital-to-analog converter (DAC) 29. An analog image signal CCDOUT 12 is provided by an image sensor (for example, a charge coupled device (CCD) sensor) to CDS 21. CDS 21 samples the image signal CCDOUT 12 and outputs an output signal CDSOUT 13. CDSOUT 13 is combined with an analog feedback signal FB 19 to form a PGA input signal PGAIN 14. PGA 23 amplifies PGAIN 14 and outputs a PGA output signal PGAOUT 15. PGAOUT 15 is converted to a digital ADC output signal ADCOUT 16 and adjusted by digital offset circuit 25 for further digital image processing. For black level calibration, data values of ADCOUT 16 based on optical black (OB) pixels are averaged by averaging circuit 27. The averaged black level value is then stored in one of the sets of registers 28 and output as an average signal AVG 18. AVG 18 thus represents the black level of the OB pixels and is converted back to analog feedback signal FB 19 to be subtracted from CDSOUT 13. This analog domain feedback calibration method usually needs long settling time to result in an accurate black level. The analog calibration method may also cause undesirable image artifacts if there is noise in the OB pixels. Furthermore, it usually requires a high resolution DAC to create the feedback signal and thus introduces additional noise.

FIG. 2 (prior art) is a simplified block diagram of an analog front end (AFE) integrated circuit 31 having a digital black level calibration circuit 40. AFE 31 includes a correlated double sampling (CDS) circuit 41, an analog-to-digital converter (ADC) 42, purely digital black level calibration circuit 40, a digital programmable gain amplifier 45, and a serial interface port 46. CDS 41 receives an analog image signal CCDOUT 32. The analog image signal CCDOUT 32 is sampled by CDS 41 and digitized into a digital ADC output signal ADCOUT 33 by ADC 42. Black level calibrator 40 determines an optical black (OB) level 34. OB level 34 is subtracted from the incoming digital signal ADCOUT 33 to obtain a black level corrected data signal (OBAD) 35. OBAD signal 35 is then adjusted by a fixed OB adjustment (OBADJ) signal 36. OBADJ signal 36 is used for compensating the difference between the OB level and the black level of valid pixels. After black level adjustment, PGA 45 amplifies PGAIN signal 37 and outputs an amplified data signal PGAOUT 38 for further digital image processing. This digital domain calibration method is able to achieve fast single field calibration. However, the OB adjustment feature is difficult to use. Every time the PGA gain value is changed, the OB adjustment OBADJ must be changed accordingly. In addition, because all of the data buses are unsigned, the lowest value of OBAD 35 signal is clamped at zero, and there is no value below the OBADJ adjustment when a positive OBADJ signal 36 is applied. This clamping creates a dead zone in image data and reduces image quality.

SUMMARY

A programmable digital black level calibration circuit comprises a combining circuit, a digital programmable gain amplifier (PGA), and a black level feedback circuit. The combining circuit, the PGA, and the feedback circuit together form a calibration feedback loop. During black level calibration, the combining circuit first combines a digital image signal for optical black (OB) pixels and a feedback signal and outputs a digital PGA input signal. The PGA then amplifies the digital PGA input signal by a PGA gain value and outputs a digital PGA output signal. The black level feedback circuit receives the digital PGA output signal and a target black level and in response outputs the feedback signal such that a black level of the OB pixels is calibrated with respect to the target black level.

In one embodiment, the feedback circuit comprises a comparator, an integrator, a feedback gain controller, and a set of OB registers. The comparator compares the digital PGA output signal to the target black level and outputs an error signal. The integrator receives the error signal and outputs an integrator output signal. The feedback controller amplifies the integrator output signal by a feedback gain value and outputs a feedback signal. The feedback signal is stored in one of the OB registers for each OB pixel.

The digital black level calibration circuit has several advantages. First, the digital black level calibration circuit calibrates the black level in pure digital domain. By using a pixel-by-pixel digital calibration, new black levels may be applied for the beginning of each valid pixel line. Second, the target black level is easily adjustable without the need for considering the PGA gain value. Third, the target black level may have a positive or negative value by using signed data buses in the black level calibration process. Image quality is improved because image data has no dead zone. Finally, either a fast or a slow calibration may be achieved by programming the loop gain of the calibration feedback loop appropriately.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 3:
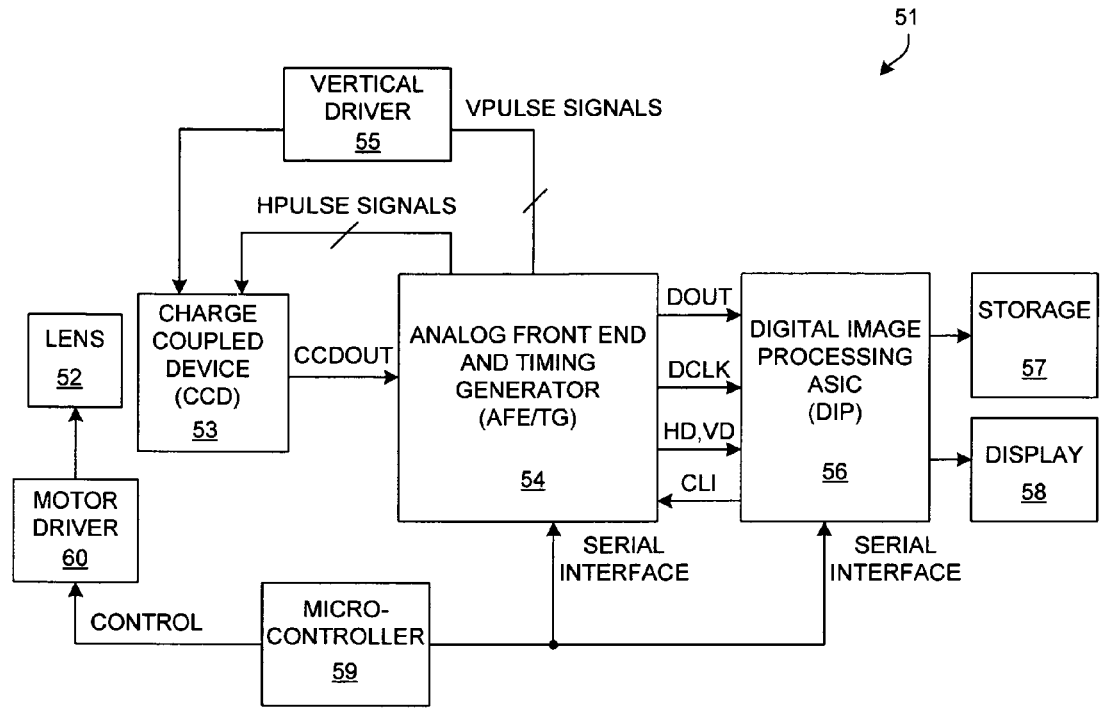
FIG. 3 is a simplified diagram of a digital camera in accordance with one novel aspect.

FIG. 3 is a simplified block diagram of a digital camera 51 in accordance with one novel aspect. An image passes through lens 52 and is captured by an image sensor 53. Image sensor 53 may, for example, be a charge coupled device (CCD) sensor or a CMOS sensor or another type of sensor. In the present example, the sensor is a CCD sensor. An analog front end (AFE) and timing generator (TG) integrated circuit 54 supplies vertical pulse signals (VPULSE signals) and horizontal pulse signals (HPULSE signals) to sensor 53 such that the sensor data (CCD OUT) is read out of the sensor and is transferred to the AFE/TG 54. AFE/TG integrated circuit 54 digitizes the image data CCDOUT received from image sensor 53 and passes the digitized image data to a digital image processing (DIP) integrated circuit 56. The digitized image data is denoted DOUT. With more details described below, AFE/TG 54 also includes a novel digital black level calibration circuit that determines the black level of the image data CCDOUT such that DOUT is corrected to achieve a desired black level. DIP 56 performs image processing on the digitized image data and then stores the image in digital form in mass storage 57. DIP 56 also causes the image to be displayed on a display 58. A microcontroller 59 provides overall key scanning, control and configuration functions for camera 51. Microcontroller 59 is coupled to AFE/TG 54 via a serial interface. Microcontroller 59 controls lens 52 via motor driver circuitry 60.

Figure 4:
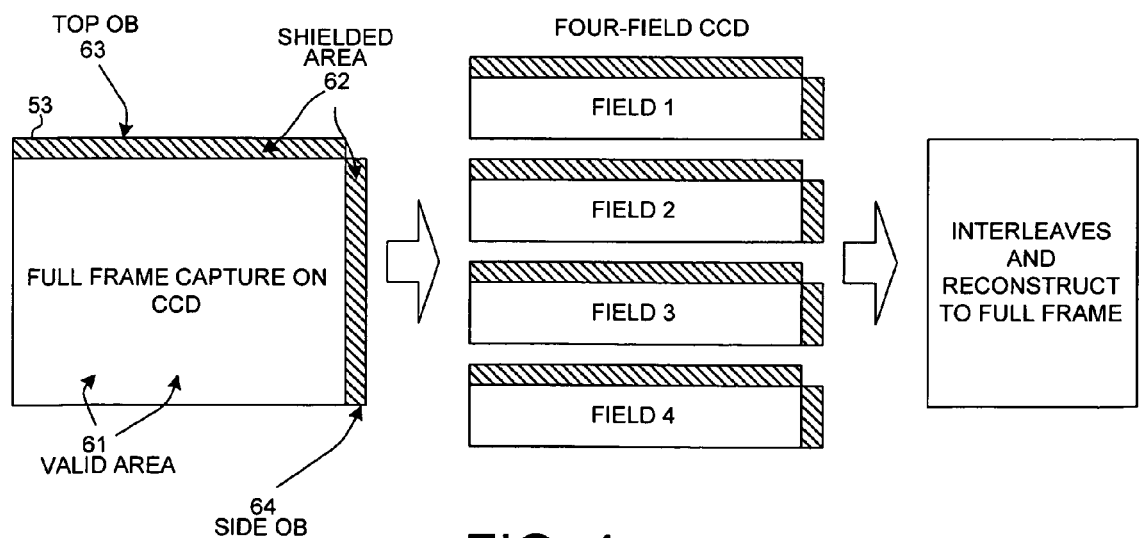
FIG. 4 is a simplified top-down view of an image sensor of FIG. 3.

FIG. 4 is a simplified top-down view of image sensor 53 of FIG. 3. Image sensor 53 includes a two-dimensional matrix of sensor elements. Each sensor element outputs an analog data value indicative of the intensity of light of each pixel detected by the sensor element. As illustrated in FIG. 4, image sensor 53 includes a valid area 61 and a shielded area 62. Valid area 61 represents valid pixels while shielded area 62 represents optical black (OB) pixels that are not illuminated. TOP OB pixels 63 are OB pixels located at the top of the valid pixels and SIDE OB pixels 64 are OB pixels located at the side of the valid pixels. In capture mode, one full frame captured by the image sensor may be split into many fields. In the example of FIG. 4, image censor 53 is a four-field CCD. Field 1 includes rows 1, 5, 9 and so on, field 2 includes rows 2, 6, 10 and so on, field 3 includes rows 3, 7, 11 and so on, and field 4 includes rows 4, 8, 12 and so on. In read out mode, the analog data values are read out of the image sensor, pixel-by-pixel, row-by-row, and field-by-field. The interleaved fields are later reconstructed to one full frame.

The analog data values output by image sensor 53 are converted into corresponding digital data values by subsequent processing circuitry AFE 54. Ideally, if a sensor element is not illuminated, then the data value output from image sensor 53 for that sensor element should correspond to a digital zero in AFE 54. The data values for OB pixels of an actual image sensor, however, are some positive values due to leakage current in the image sensor. In addition, the values often vary due to changing supply voltage, temperature, and the like. Therefore, to improve image quality and to achieve desired image brightness, the "optical black level" or "OB level" of image sensor output data needs to be calibrated with respect to a target black level. For example, if a brighter image is desired, then the target black level is relatively small. On the other hand, if a darker image is desired, then the target black level is relatively large. This process of obtaining the OB level is referred as "black level calibration". During black level calibration, AFE/TG 54 reads out the data values from shielded sensor elements to obtain the OB level that sensor elements will output if they are not illuminated. As each row of sensor elements is read, the OB pixel values from TOP OB 63 and SIDE OB 64 may be accumulated to obtain the OB level, which is further adjusted with respect to the target black level. The resulting adjusted OB level is then subtracted from the image sensor output data values for the valid pixels so that the corrected data values will have a desired black level under dark conditions.

Figure 5:
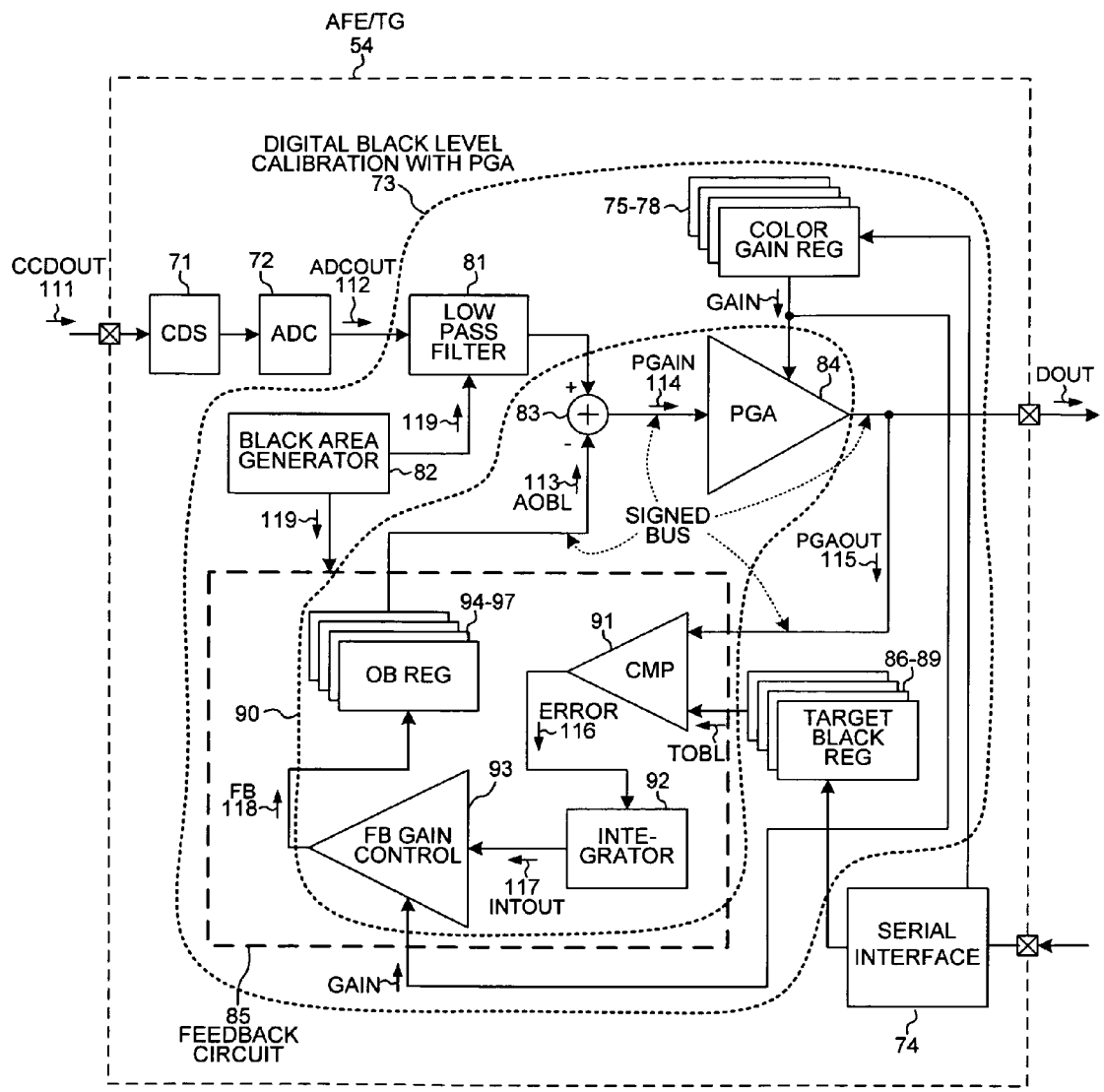
FIG. 5 is a detailed block diagram of an AFE integrated circuit in accordance with one novel aspect.

FIG. 5 is a block diagram of AFE/TG integrated circuit 54 having a digital black level calibration circuit 73 in accordance with one novel aspect. AFE 54 includes a correlated double sampling (CDS) circuit 71, a 19-bit analog-to-digital converter (ADC) 72, digital black level calibration circuit 73, and a serial interface 74. Digital black level calibration circuit 73 includes a low pass filter 81, a black area generator 82, a combining circuit 83, a digital programmable gain amplifier (PGA) 84, a black level feedback circuit 85, a set of color gain registers 75-78, and a set of target black registers 86-89. Feedback circuit 85 includes a comparator 91, an integrator 92, a feedback gain controller 93, and a set of OB registers 94-97. As illustrated in FIG. 5, a set of four color gain registers 75-78 are used for programming the gain values of PGA 84 and feedback gain controller 93 for different colors of images. Similarly, a set of four target black registers 86-89 and a set of four OB registers 94-97 are also used for different colors of images. In addition, digital PGA 84 and feedback circuit 85 processes all the digital signals using signed data buses.

AFE/TG 54 receives an analog image signal CCDOUT 111 from image sensor 53. AFE/TG 54 processes CCDOUT 111 using two different operational modes: a normal operational mode for valid pixels and a black level calibration mode for OB pixels. In the example of FIG. 5, black area generator 82 outputs a back area indication signal 119. AFE 54 operates in normal operational mode when black area indication signal 119 is unasserted for valid pixels and operates in black level calibration mode when black area indication signal 119 is asserted for OB pixels. Alternatively, black area indication signal 119 may be received by AFE/TG 54 externally through a terminal without the use of black area generator 82.

Figure 6:
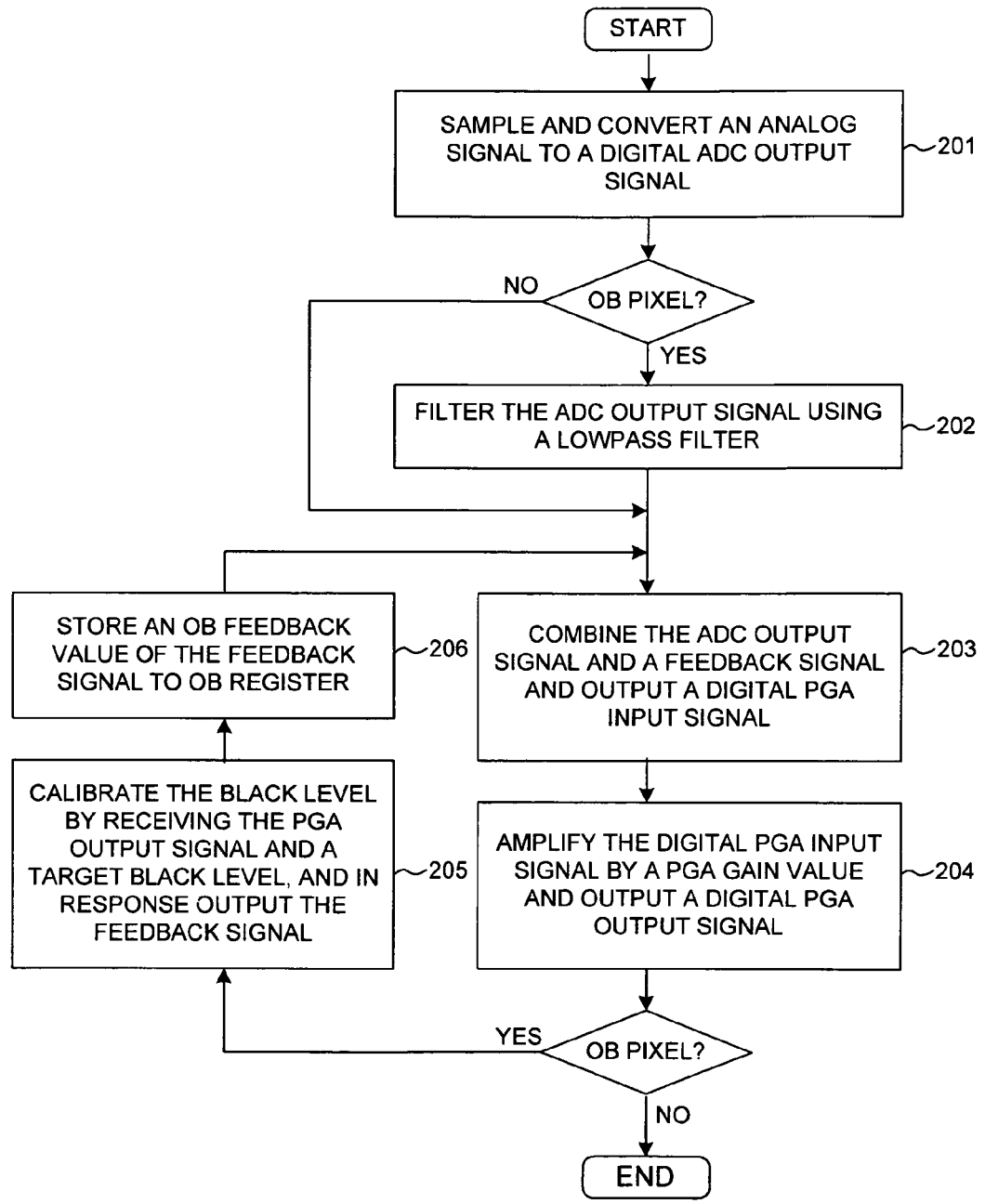
FIG. 6 is a flow chart that illustrates a black level calibration process with a feedback control loop in accordance with one novel aspect.

FIG. 6 is a flow chart that illustrates the operation of AFE 54. CCDOUT 111 is first sampled by CDS 71 and then converted to a digital image signal ADCOUT 112 by ADC 72 (step 201). In normal operational mode for valid pixels, low pass filter 82 is deactivated and ADCOUT 112 simply passes through. In addition, feedback circuit 85 is also deactivated. However, an adjusted optical black level (AOBL) 113 for a particular color stored in one of the corresponding OB registers 94-97 continues to be provided to combining circuit 83 (step 206). As a result, digital image signal ADCOUT 112 is combined with AOBL 113 (step 203). In the example of FIG. 5, ADCOUT 112 is subtracted by AOBL 113 such that the corrected data values will have a desired digital value under dark conditions. The corrected digital signal PGAIN 114 is then amplified by PGA 84 (step 204). The amplified PGA output signal PGAOUT 115 (equivalent to DOUT) is passed to DIP 56 for further digital image processing.

In black level calibration mode for OB pixels, black area indication signal 119 is asserted. Digital image signal ADCOUT 112 is therefore filtered by low pass filer 82 to smooth out the black level variation for OB pixels (step 202). The filtered ADCOUT 112 is first combined with AOBL 113 (step 203) and then amplified by PGA 84 (step 204). Because black area indication signal 119 is asserted for OB pixels, feedback circuit 85 is also activated. Feedback circuit 85 receives PGA amplified digital signal PGAOUT 114 and in response generates a feedback signal FB 118 (step 205). The value of feedback signal FB 118 is then stored in one of the OB registers 94-97 to update the value of AOBL 113 for a particular color (step 206). When AFE/TG 54 switches back to normal operational mode (for instance, at the beginning of a new valid row), feedback circuit 85 is deactivated and AOBL 113 is equal to a final value stored in one of the OB registers 94-97. This final value represents the final adjusted optical black level for that particular color. The final value of AOBL 113 is then used to correct image signal ACDOUT 112 and remain unchanged in normal operational mode.

The purpose of feedback circuit 85 is to generate a correction signal AOBL 113 based on the OB pixels such that the corrected digital image signal ADCOUT 112 has a target black level under dark conditions. Every different color of every different field of an image may have its own target black level to achieve the desired brightness and other visual effects of the image. Therefore, target black level TOBL may be programmed by writing the desired value into one of the target black registers 86-89 through serial interface 74. The detailed operation of feedback circuit 85 involves the following steps. First, comparator 91 compares PGAOUT 115 to a target black level TOBL and outputs an error signal ERROR 116. Second, integrator 92 receives ERROR 116 and outputs an integrator output signal INTOUT 117. In one example, integrator 92 is an accumulator that generates the sum of the input signal ERROR 116 and the previously accumulated output signal INTOUT 117. Next, FB gain controller 93 receives INTOUT 117 and amplifies INTOUT 117 by an appropriate feedback gain value to generate feedback signal FB 118. Finally, feedback signal FB 118 is stored in one of the OB registers 94-97 to update the value of AOBL 113 for each OB pixel. After a certain amount of OB pixels are processed, the value of AOBL 113 eventually converges to the difference between the average OB level and the target black level TOBL. As a result, the OB pixels are calibrated with respect to the target black level TOBL.

Digital black level calibration circuit 73 with feedback circuit 85 has many advantages. In a first novel aspect, black level calibration is performed in pure digital domain using a high resolution ADC coupled with a digital PGA. In addition, an accurate average black level of the OB pixels is no longer required during the calibration process. Instead, by using a pixel-by-pixel digital calibration, adjusted black level AOBL 113 is updated dynamically and may be applied at the beginning of each line of valid pixels.

Figures 7, 8:
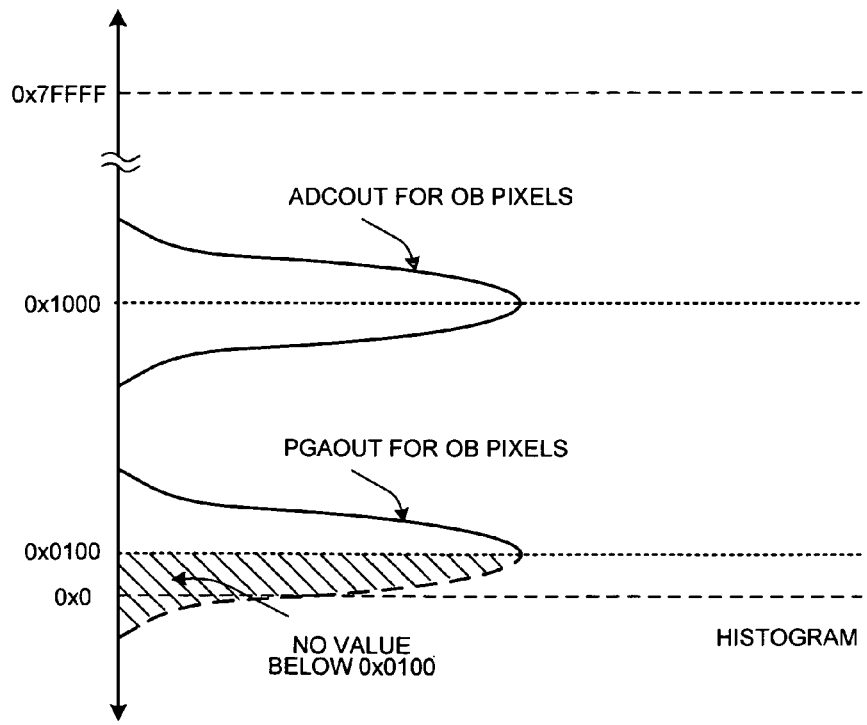
FIG. 7 is a table that illustrates the differences between the AFE of FIG. 2 and the AFE of FIG. 5.
FIG. 8 is a diagram that illustrates the noise distribution curve of optical black pixels.

In a second novel aspect, target black level TOBL is easily adjustable without the need for considering the gain settings of PGA 84. As illustrated in FIG. 5, combining circuit 83, PGA 84, and feedback circuit 85 together form calibration feedback loop 90. Whenever TOBL is changed to a new value, the OB pixels will automatically be calibrated with respect to the new TOBL value through calibration feedback loop 90. FIG. 7 is a table that illustrates the differences between the prior art AFE 31 of FIG. 2 and novel AFE 54 of FIG. 5. In the example of FIG. 7, the digital ADC output signal has a digital value of 0x1000, and the desired black level is 0x0100. For AFE 31 of FIG. 2, if the PGA has a gain value of one, then the optical black adjustment OBADJ should be set to 0x0100. However, if the PGA has a gain value of four, then the optical black adjustment OBADJ should be set to 0x0040 (0x0100 divided by the gain value of four). On the other hand, for AFE 54 of FIG. 5, the target black level TOBJ is always set to the desired value of 0x0100 regardless of the PGA gain value. The adjusted optical black level AOBL 113 of FIG. 5 is automatically obtained such that the digital PGA output signal PGAOUT 115 for OB pixels is equal to 0x010. Therefore, using the novel digital black level calibration of FIG. 5, a user can easily program a desired target black level into target black registers 86-89, and the OB pixels will be automatically calibrated accordingly.

Figure 1:
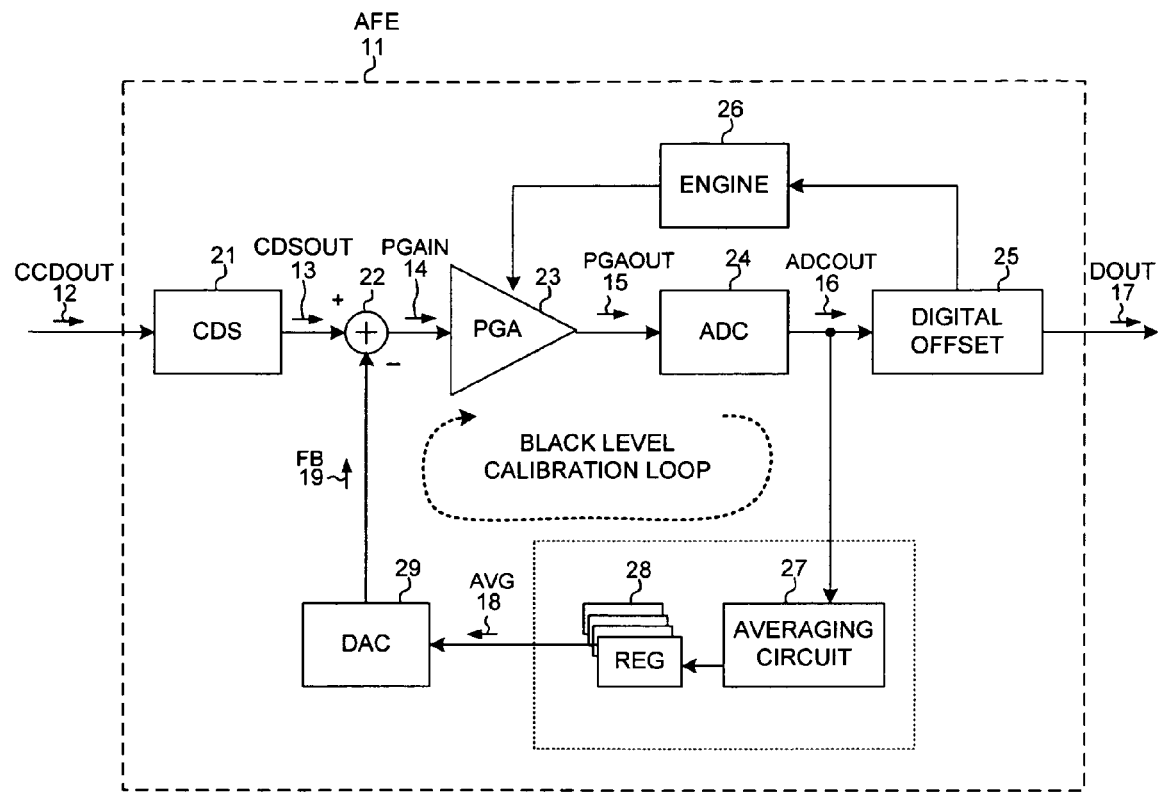
FIG. 1 (prior art) is a simplified block diagram of an analog front end (AFE) integrated circuit having an analog black level calibration circuit.
Figure 2:
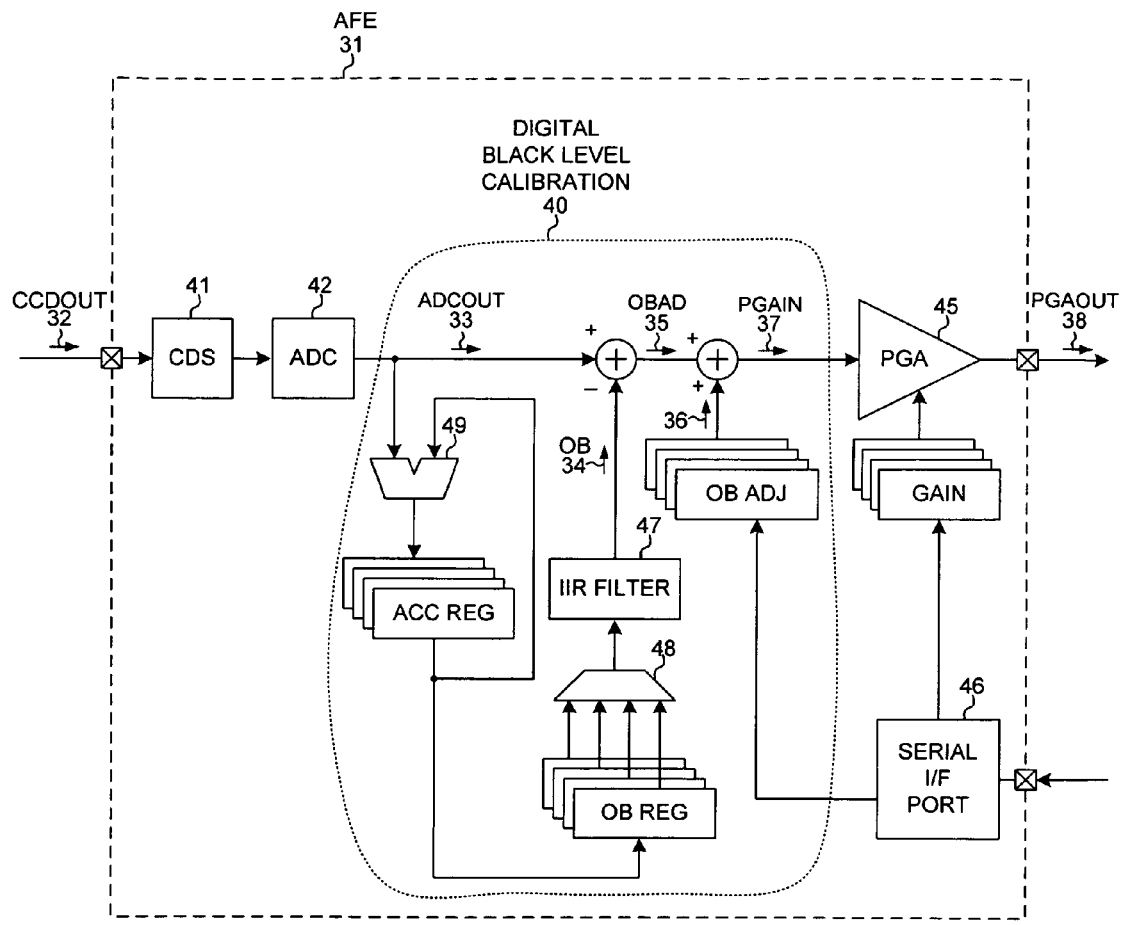
FIG. 2 (prior art) is a simplified block diagram of an analog front end (AFE) integrated circuit having a digital black level calibration circuit.

In a third novel aspect, the target black level TOBL can have a positive or negative value by using signed data buses in the black level calibration process. FIG. 8 is a diagram that illustrates the noise distribution curves of OB pixel values of FIG. 2 and FIG. 5. For both FIG. 2 and FIG. 5, the digitized ADC output signal ADCOUT has a range from zero to 0x7FFFF (19-bit ADC), and each ADCOUT for OB pixels has a noise distribution curve with an average value of 0x1000. For AFE 31 of FIG. 2, if the optical black adjustment OBADJ is set to 0x0100, then no corrected pixel data value of PGAOUT can have a value between 0 and 0x0100 because the lowest OBAD value is clipped to zero. This clipping increases the dead zone and reduces image quality. Therefore, OBADJ in FIG. 2 is limited to be a small positive number to avoid image deterioration. On the other hand, for AFE 54 of FIG. 5, the target black level TOBL can be set to any positive or negative number because all the signals are carried by a signed data bus and can have any value ranged from negative to positive.

Figure 9:
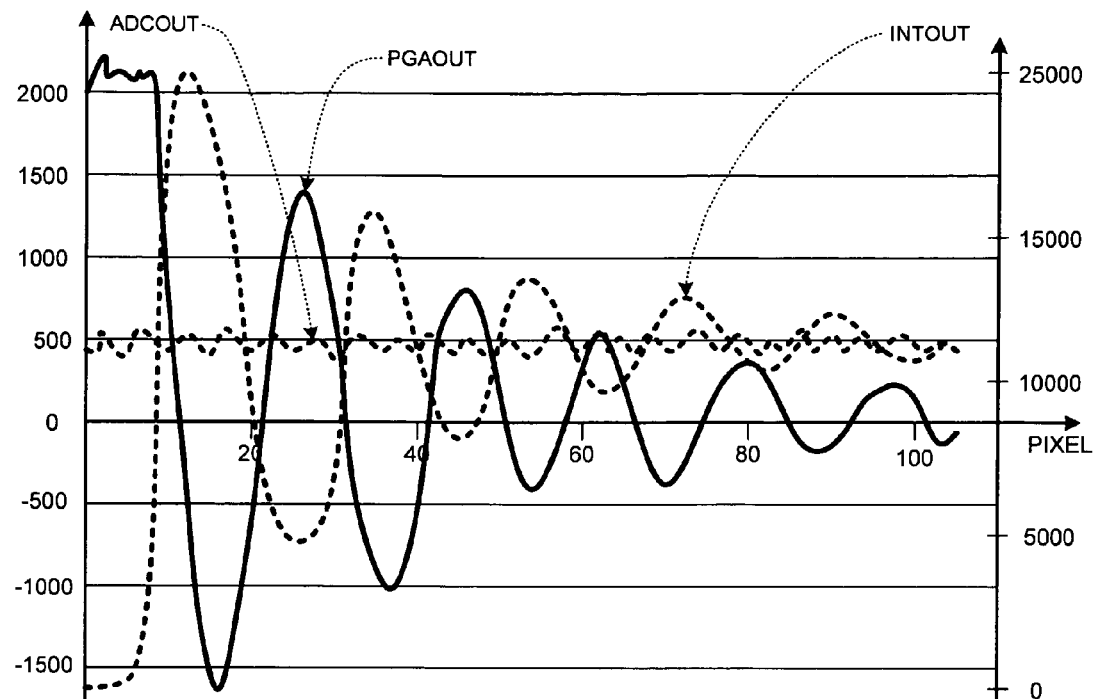
FIG. 9 is a waveform diagram that illustrates signal waveforms under a first feedback gain control setting.
Figure 10:
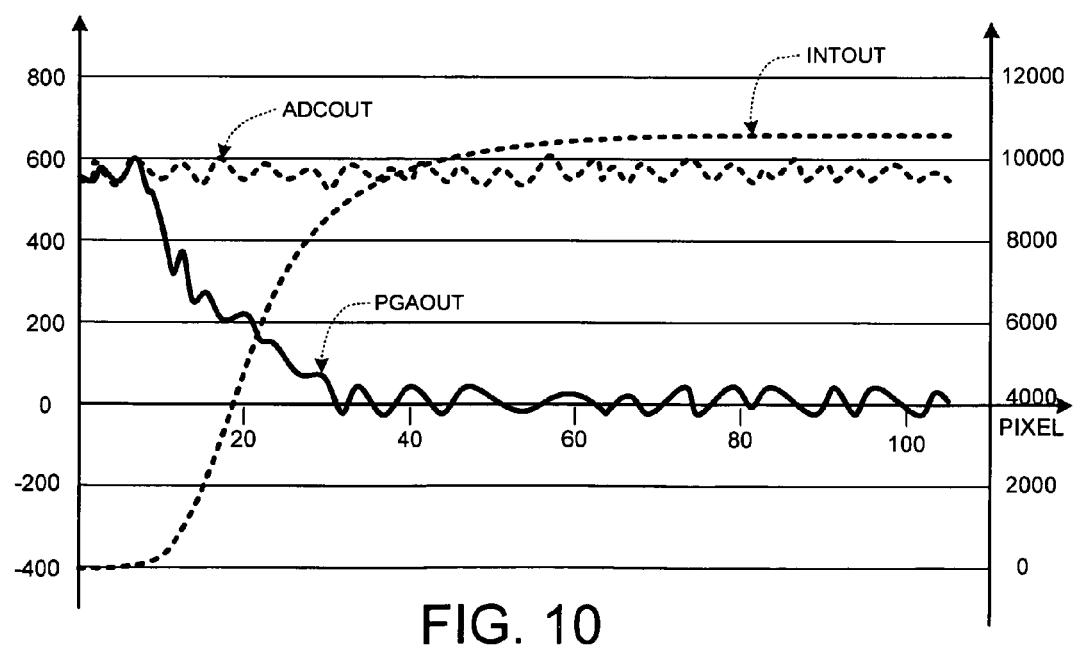
FIG. 10 is a waveform diagram that illustrates signal waveforms under a second feedback gain control setting.

In a fourth novel aspect, by changing the loop gain of calibration feedback loop 90, either a fast or a slow calibration is achievable. FIG. 9 is a waveform diagram that illustrates signal waveforms under a first loop gain value of 0.2, and FIG. 10 is a waveform diagram that illustrates signal waveforms under a second loop gain value of 0.05. In the examples of both FIGS. 9 and 10, the target black level TOBL is set to 10, and the digitized image signal ADCOUT 112 for OB pixels has an average value of 500 with 20% noise. In the example of FIG. 9, the PGA gain value of PGA 84 is set to 4, the feedback gain value of feedback controller 93 is set to 0.05, and the integrator gain of integrator 92 is set to 1. The total loop gain of calibration feedback loop 90 is therefore equal to 0.2. As illustrated in FIG. 9, with the loop gain of 0.2, the PGA output signal PGAOUT 115 has an oscillatory response and slowly converges to TOBL.

On the other hand, in the example of FIG. 10, the PGA gain of PGA 84 value is set to 1, the feedback gain value of feedback gain controller 93 is set to 0.05, and the integrator gain of integrator 92 is set to 1. The total loop gain of the calibration feedback loop 90 is therefore equal to 0.05. As illustrated in FIG. 10, with the loop gain of 0.05, the PGA output signal PGAOUT 115 has an asymptotic response and smoothly converges to TOBL without oscillation. Therefore, if the loop gain of calibration feedback loop 90 is maintained at a value close to 0.05, then a desired calibration response may be achieved. During image processing, when the PGA gain value of PGA 84 changes, the feedback gain value of feedback gain controller 93 can be changed accordingly through color gain registers 75-78 to maintain the desired calibration response. Furthermore, a faster or a slower calibration may be programmed by slightly tuning the loop gain value of calibration feedback loop 90.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A device, comprising:
   a combining circuit that combines a digital image signal and a feedback signal and outputs a digital programmable gain amplifier (PGA) input signal;
   a digital programmable gain amplifier (PGA) that amplifies the digital PGA input signal by a PGA gain value and outputs a digital PGA output signal; and
   a feedback circuit that receives the digital PGA output signal and a target black level and in response outputs the feedback signal such that a black level of the digital image signal is calibrated with respect to the target black level.

2. The device of claim 1, wherein the device is part of an analog front end (AFE) integrated circuit of a digital camera, and wherein the digital image signal represents a sequence of optical black (OB) pixel values from an image sensor of the digital camera.

3. The device of claim 1, wherein the target black level is adjustable to have a value between a negative number and a positive number.

4. The device of claim 1, wherein the combining circuit subtracts the feedback signal from the digital image signal.

5. The device of claim 1, wherein the feedback circuit comprises:
   a comparator that compares the digital PGA output signal to a target black level and in response outputs an error signal;
   an integrator that receives the error signal and in response outputs an integrator output signal;
   a feedback gain control amplifier that amplifies the integrator output signal by a feedback gain value and outputs the feedback signal; and
   an OB register that stores an OB feedback value of the feedback signal.

6. The device of claim 5, wherein the integrator accumulates the error signal with the integrator output signal.

7. The device of claim 1, wherein the combining circuit, the PGA and the feedback circuit form a calibration feedback loop, and wherein the loop gain value of the calibration feedback loop is programmable to obtain a desired calibration response.

8. The device of claim 1, wherein the digital PGA input signal and the feedback signal are carried by signed data buses.

9. The device of claim 1, further comprising:
   a black area generator that generates a black area indication signal for OB pixels, wherein an OB feedback value of the feedback signal is stored in an OB register, and wherein the feedback circuit is deactivated such that a final OB feedback value stored in the OB register remains unchanged when the black area indication signal is unasserted.

10. The device of claim 9, further comprising:
   a low pass filter that filters the digital image signal when the black area indication signal is asserted.

11. The device of claim 1, further comprising:
   a serial interface, wherein the target black level is loaded into a target black register via the serial interface, and wherein the PGA gain value is also loaded into a gain register via the serial interface.

12. A method, comprising:
   (a) receiving a digital image signal, wherein the digital image signal represents a sequence of digitized optical black (OB) pixels from an image sensor;
   (b) combining the digital image signal and a feedback signal and outputting a digital programmable gain amplifier (PGA) input signal;
   (c) amplifying the digital PGA input signal by a PGA gain value and outputting a digital PGA output signal; and
   (d) calibrating a black level of the digital image signal with respect to a target black level by receiving the digital PGA output signal and the target black level and in response outputting the feedback signal.

13. The method of claim 12, wherein the target black level is adjustable to have a value between a negative number and a positive number.

14. The method of claim 12, wherein the combining in (b) involves subtracting the feedback signal from the digital image signal.

15. The method of claim 12, wherein the calibrating in (d) comprises:
   comparing the digital PGA output signal to a target black level and in response outputting an error signal;
   receiving the error signal and in response outputs an integrator output signal;
   amplifying the integrator output signal by a feedback gain value and outputs the feedback signal; and
   storing an OB feedback value of the feedback signal.

16. The method of claim 15, wherein both the PGA gain value and the feedback gain value are programmable to obtain a desired calibration response.

17. The method of claim 12, further comprising:
   (e) receiving a black area indication signal for the sequence of OB pixels, wherein an OB feedback value of the feedback signal is stored in an OB register, and wherein the calibrating in (d) is deactivated such that a final OB feedback value stored in the OB register remains unchanged when the black area indication signal is unasserted.

18. The method of claim 17, further comprising:
   (f) filtering the digital image signal using a low pass filter when the black area indication signal is asserted.

19. The method of claim 12, wherein the digital PGA input signal and the feedback signal are carried by signed data buses.

20. A device, comprising:
   an analog to digital converter (ADC) that converts an analog signal to a digital ADC output signal, wherein the analog signal represents a black level of a sequence of optical black (OB) pixels; and
   means for calibrating the black level with respect to a target black level, wherein the digital ADC output signal is combined with a feedback signal and amplified to output an amplified signal, and wherein the amplified signal and the target black level are used to generate the feedback signal in calibrating the black level.

21. The device of claim 20, wherein the target black level is adjustable to have a value between a negative number and a positive number.

22. The device of claim 20, wherein the feedback signal is carried by a signed bus.

23. The device of claim 20, wherein the means includes a digital programmable gain amplifier (PGA).

* * * * *